(12) United States Patent
Xiao et al.

(10) Patent No.: US 12,001,095 B2
(45) Date of Patent: Jun. 4, 2024

(54) BACKLIGHT MODULE, MANUFACTURING METHOD THEREOF, AND LIQUID CRYSTAL DISPLAY DEVICE

(71) Applicant: TCL CHINA STAR OPTOELECTRONICS TECHNOLOGY CO., LTD., Shenzhen (CN)

(72) Inventors: Juncheng Xiao, Shenzhen (CN); Yan Li, Shenzhen (CN); Bin Zhao, Shenzhen (CN); Ji Li, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 302 days.

(21) Appl. No.: 17/288,664

(22) PCT Filed: Mar. 15, 2021

(86) PCT No.: PCT/CN2021/080729
§ 371 (c)(1),
(2) Date: Apr. 26, 2021

(87) PCT Pub. No.: WO2022/170658
PCT Pub. Date: Aug. 18, 2022

(65) Prior Publication Data
US 2023/0144891 A1    May 11, 2023

(30) Foreign Application Priority Data

Feb. 10, 2021    (CN) .......................... 202110185178.8

(51) Int. Cl.
*G02F 1/13357* (2006.01)
*H01L 33/00* (2010.01)
*H01L 33/62* (2010.01)

(52) U.S. Cl.
CPC .. *G02F 1/133603* (2013.01); *G02F 1/133605* (2013.01); *H01L 33/005* (2013.01); *H01L 33/62* (2013.01); *H01L 2933/0066* (2013.01)

(58) Field of Classification Search
CPC ..................... H01L 33/62; H01L 2924/12041
See application file for complete search history.

(56) References Cited

U.S. PATENT DOCUMENTS 9,172,004 B2 * 10/2015 Choi ....................... H01L 24/17
2013/0175559 A1 * 7/2013 Kobayakawa .......... H01L 33/60
257/89

(Continued)

FOREIGN PATENT DOCUMENTS

CN    107994046 A    5/2018
CN    109307955 A    2/2019

(Continued)

*Primary Examiner* — Andrew J Coughlin
(74) *Attorney, Agent, or Firm* — The Roy Gross Law Firm, LLC; Roy Gross

(57) ABSTRACT

The application provides a backlight module, a manufacturing method thereof, and a liquid crystal display device. The backlight module includes a substrate, and a light-emitting chip and a reflective layer disposed on the substrate. Wherein, the reflective layer has a hollowed-out region, the light-emitting chip is electrically connected to the substrate in the hollowed-out region, and a projection of an edge of the hollowed-out region on the substrate is at least partially within a coverage of a projection of the light-emitting chip on the substrate to improve luminous efficiency.

16 Claims, 5 Drawing Sheets

(56) References Cited

U.S. PATENT DOCUMENTS

| | | | |
|---|---|---|---|
| 2016/0240746 A1* | 8/2016 | Yun | H01L 33/54 |
| 2017/0271290 A1* | 9/2017 | Liao | H01L 24/83 |
| 2018/0053882 A1* | 2/2018 | Cheng | H01L 33/60 |
| 2019/0341536 A1* | 11/2019 | Choi | H01L 33/502 |
| 2019/0348571 A1 | 11/2019 | Kim et al. | |
| 2020/0227373 A1* | 7/2020 | Song | H01L 24/82 |

FOREIGN PATENT DOCUMENTS

| | | |
|---|---|---|
| CN | 109324444 A | 2/2019 |
| CN | 110364608 A | 10/2019 |
| CN | 111276471 A | 6/2020 |
| KR | 102059126 B1 | 12/2019 |
| WO | 2019235752 A1 | 12/2019 |

\* cited by examiner

BACKLIGHT MODULE, MANUFACTURING METHOD THEREOF, AND LIQUID CRYSTAL DISPLAY DEVICE

CROSS REFERENCE TO RELATED APPLICATIONS

This application is a National Phase of PCT Patent Application No. PCT/CN2021/080729 having International filing date of Mar. 15, 2021, which claims the benefit of priority of Chinese Application No. 202110185178.8 filed Feb. 10, 2021. The contents of the above applications are all incorporated by reference as if fully set forth herein in their entirety.

FIELD OF INVENTION

The present application relates to the field of display technologies, and in particular to a backlight module, a manufacturing method thereof, and a liquid crystal display device.

BACKGROUND OF INVENTION

As liquid crystal display devices gradually develop toward an ultra-narrow frame, it is required that a backlight module providing backlight for liquid crystal display panels occupies as little frame space as possible. Traditional backlight module is mainly composed of light-emitting diode (LED) lamp beads. According to different installation positions, the backlight module can be classified into two types of side-lit backlight module and direct-lit backlight module. The side-lit backlight module is disposed on a side of the liquid crystal display panels, so that the liquid crystal display devices with the side-lit backlight module cannot achieve ultra-narrow frame. The direct-lit backlight module is disposed on a backside of the liquid crystal display panels, so that the liquid crystal display devices with a direct-lit backlight module can realize the ultra-narrow frame, but this will increase an overall thickness of the liquid crystal display devices.

A new type of backlight module developed nowadays is a sub-millimeter light-emitting diode (mini-LED) backlight module. The mini-LED backlight module uses a smaller mini-LED chip to replace traditional LED lamp beads, the mini-LED backlight module is disposed on the backside of the liquid crystal display panel, which not only enables the liquid crystal display devices with the mini-LED backlight module to realize the ultra-narrow frame, but also reduces the overall thickness of the liquid crystal display devices. However, a light-outputting efficiency of the conventional mini-LED backlight module is lower.

SUMMARY OF INVENTION

Technical Problem

The present application provides a backlight module, a manufacturing method thereof, and a liquid crystal display device, so as to solve the problem of lower light-outputting efficiency of the conventional mini-LED backlight module.

Technical Solutions

In a first aspect, the present application provides a backlight module, which includes a substrate, a light-emitting chip and a reflective layer disposed on the substrate. Wherein the reflective layer includes a hollowed-out region, the light-emitting chip is electrically connected to the substrate in the hollowed-out region, and a projection of an edge of the hollowed-out region on the substrate is at least partially positioned within a coverage of a projection of the light-emitting chip on the substrate.

In some embodiments, the projection of the edge of the hollowed-out region on the substrate is positioned within the projection of the light-emitting chip on the substrate, and a distance between the edge of the hollowed-out region and the projection of the light-emitting chip on the substrate is greater than a first predetermined value.

In some embodiments, a surface of the substrate is disposed with a pad layer, the light-emitting chip includes a chip body and a pin layer electrically connected to the chip body, and the pin layer is electrically connected to the pad layer through a conductive layer in the hollowed-out region.

In some embodiments, the pad layer includes a first pad and a second pad, the pin layer includes a first pin and a second pin, the conductive layer includes a first conductor and a second conductor, the hollowed-out region includes a first hollowed-out sub-region and a second hollowed-out sub-region, wherein the first pin in the first hollowed-out sub-region is electrically connected to the first pad through the first conductor, and the second pin in the second hollowed-out sub-region is electrically connected to the second pad through the second conductor.

In some embodiments, a projection of the chip body on the substrate covers a part of a projection of the pad layer on the substrate, and the reflective layer is at least partially disposed on a surface of the pad layer.

In some embodiments, a projection of the chip body on the substrate entirely covers a projection of the pad layer on the substrate, and the reflective layer is at least partially disposed on a surface of the substrate.

In some embodiments, a distance between the reflective layer and the chip body in a direction perpendicular to the substrate is greater than a second predetermined value.

In some embodiments, a distance between a projection of any one of the conductive layer or the pin layer on the substrate and a projection of the edge of the hollowed-out region on the substrate is greater than a third predetermined value.

In some embodiments, a material of the reflective layer includes white oil.

In some embodiments, the conductive layer is made of a conductive glue.

In a second aspect, the present application provides a manufacturing method of a backlight module, including:
  providing a substrate, and fabricating a reflective layer with a hollowed-out region on the substrate; and
  electrically connecting a light-emitting chip to the substrate in the hollowed-out region, wherein a projection of an edge of the hollowed-out region on the substrate is at least partially positioned within a coverage of a projection of the light-emitting chip on the substrate.

In some embodiments, the projection of the edge of the hollowed-out region on the substrate is positioned within the projection of the light-emitting chip on the substrate, and a distance between the edge of the hollowed-out region and the projection of the light-emitting chip on the substrate is greater than a first predetermined value.

In a third aspect, the present application provides a liquid crystal display device, including a liquid crystal display panel and a backlight module; wherein the backlight module includes a substrate and a light-emitting chip and a reflective layer disposed on the substrate, the reflective layer includes a hollowed-out region, the light-emitting chip is electrically connected to the substrate in the hollowed-out region, and a projection of an edge of the hollowed-out region on the substrate is at least partially positioned within a coverage of a projection of the light-emitting chip on the substrate.

In some embodiments, the projection of the edge of the hollowed-out region on the substrate is positioned within the projection of the light-emitting chip on the substrate, and a distance between the edge of the hollowed-out region and the projection of the light-emitting chip on the substrate is greater than a first predetermined value.

In some embodiments, a surface of the substrate is disposed with a pad layer, the light-emitting chip includes a chip body and a pin layer electrically connected to the chip body, and the pin layer is electrically connected to the pad layer through a conductive layer in the hollowed-out region.

In some embodiments, the pad layer includes a first pad and a second pad, the pin layer includes a first pin and a second pin, the conductive layer includes a first conductor and a second conductor, and the hollowed-out region includes a first hollowed-out sub-region and a second hollowed-out sub-region, wherein the first pin in the first hollowed-out sub-region is electrically connected to the first pad through the first conductor, and the second pin in the second hollowed-out sub-region is electrically connected to the second pad through the second conductor.

In some embodiments, a projection of the chip body on the substrate covers a part of a projection of the pad layer on the substrate, and the reflective layer is at least partially disposed on a surface of the pad layer.

In some embodiments, a projection of the chip body on the substrate entirely covers a projection of the pad layer on the substrate, and the reflective layer is at least partially disposed on the surface of the substrate.

In some embodiments, a distance between the reflective layer and the chip body in a direction perpendicular to the substrate is greater than a second predetermined value.

In some embodiments, a distance between a projection of any one of the conductive layer or the pin layer on the substrate and a projection of an edge of the hollowed-out region on the substrate is greater than a third predetermined value.

Beneficial Effect

In the backlight module, the manufacturing method thereof, and the liquid crystal display device provided by the present application, the light originally irradiated by the light-emitting chip on the substrate, the first pad, or the second pad will irradiate to the reflective layer, and be reflected by the reflective layer and then emitted from the backlight module, thereby improving a luminous efficiency of the backlight module.

DETAILED DESCRIPTION OF EMBODIMENTS

In order to make the purpose, technical solutions, and effects of the present application in a clearer manner, the following further describes the present application in detail with reference to the accompanying drawings and embodiments. It should be understood that the specific embodiments described here are only used to explain the present application, and are not used to limit the present application.

Figure 1:
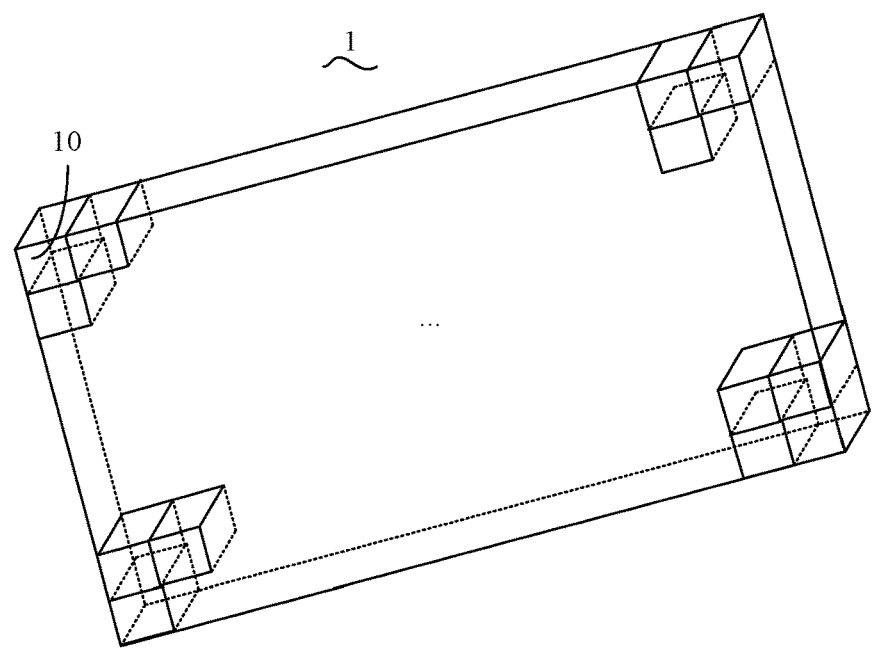
FIG. 1 is a schematic structural diagram of a backlight module provided by an embodiment of the present application.
Figure 2:
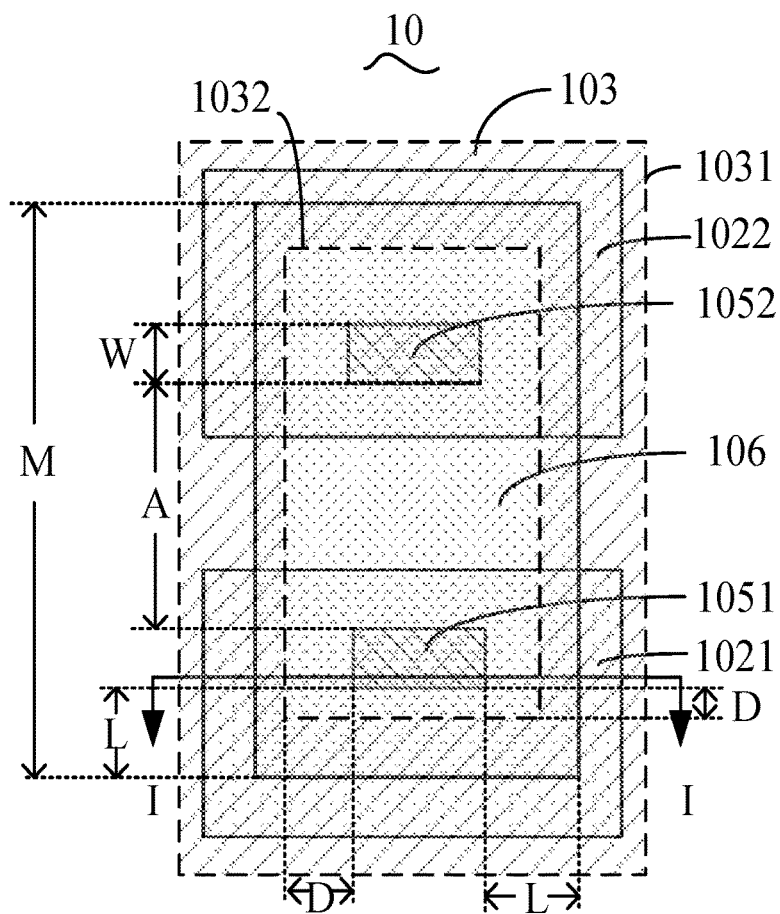
FIG. 2 is a schematic partial top view of a first backlight module provided by an embodiment of the present application.
Figure 3:
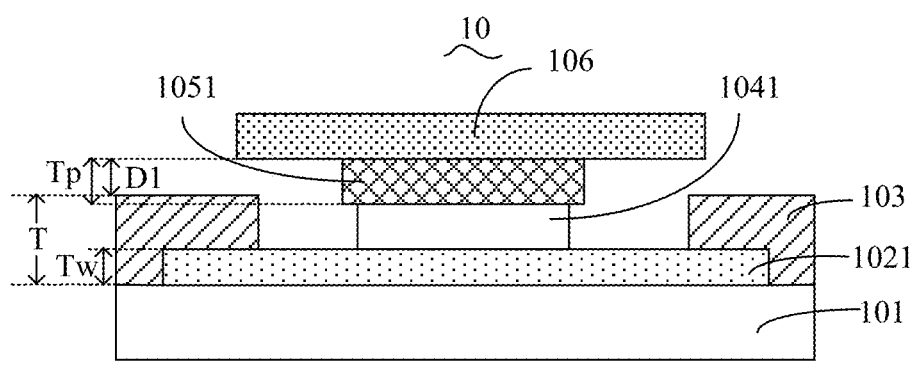
FIG. 3 is a cross-sectional view of the backlight module shown in FIG. 2 along line I-I.

FIG. 1 is a schematic structural diagram of a backlight module provided by an embodiment of the present application, FIG. 2 is a partial top view schematic diagram of a first backlight module provided by an embodiment of the present application, and FIG. 3 is a schematic diagram of the backlight module shown in FIG. 2 along line I-I. It should be noted that the backlight module in the embodiments of the present application is a sub-millimeter light-emitting diode (mini-LED) backlight module, which is referred to as a backlight module for ease of description. As shown in FIG. 1, the backlight module 1 includes a plurality of light-emitting regions 10. FIG. 2 only shows a single light-emitting region 10. As shown in FIG. 2 and FIG. 3, the light-emitting region 10 includes a substrate 101 and a light-emitting chip and a reflective layer 103. Wherein, the light-emitting chip is a chip capable of emitting light, and the light-emitting chip in the embodiments of the present application is a mini-LED chip. The reflective layer 103 is a functional layer that reflects light. The reflective layer 103 is disposed on a light path of the light emitted from the light-emitting chip to the substrate 101. The reflective layer 103 is used to reflect the light irradiated by the light-emitting chip to the reflective layer 103 and then emit it from the backlight module. The reflective layer 103 can be white oil.

The reflective layer 103 includes a hollowed-out region. A projection of the reflective layer 103 on the substrate 101 includes an outer edge 1031 and an inner edge 1032. A projection of an edge of the hollowed-out region on the substrate 101 is the aforementioned inner edge 1032. The light-emitting chip is electrically connected to the substrate 101 in the hollowed-out region. Wherein, the outer edge 1031 surrounds a projection of the light-emitting chip on the substrate 101 and is spaced from the projection of the light-emitting chip on the substrate 101, and the inner edge 1032 is at least partially positioned within a coverage of the projection of the light-emitting chip on the substrate 101.

Specifically, the projection of the light-emitting chip on the substrate 101 is rectangular, the outer edge 1031 encloses a closed region and the closed region is rectangular, and the outer edge 1031 is spaced from the projection of the light-emitting chip on the substrate 101. It should be noted that the projection of the light-emitting chip on the substrate 101 can also be square, circular, or other shapes, which are mainly determined according to a shape of the light-emitting chip. A shape of the closed region enclosed by the outer edge 1031 can also be square, circular, or other shapes, which can be flexibly adjusted by those skilled in the art according to actual application requirements.

The inner edge 1032 encloses a closed region and the closed region is rectangular. The inner edge 1032 is positioned within the projection of the light-emitting chip on the substrate 101, and a distance between the inner edge 1032 and the projection of the light-emitting chip on the substrate 101 is greater than a first predetermined value. Wherein, the first predetermined value can be flexibly adjusted by those skilled in the art according to actual application requirements. It should be noted that the closed region enclosed by the inner edge 1032 can also be square, circular, or other shapes, and those skilled in the art can flexibly adjust according to actual application requirements. The closed region enclosed by the inner edge 1032 can also coincide with the projection of the light-emitting chip on the substrate 101, that is, there is no distance between the inner edge 1032 and the projection of the light-emitting chip on the substrate 101.

Since the outer edge 1031 of the reflective layer 103 projected on the substrate 101 surrounds the projection of the light-emitting chip on the substrate 101 and is spaced from the projection of the light-emitting chip on the substrate 101, the inner edge 1032 of the reflective layer 103 projected on the substrate 101 is at least partially positioned within the coverage of the projection of the light-emitting chip on the substrate 101. Therefore, the light originally irradiated by the light-emitting chip on the substrate 101, a first pad 1021, or a second pad 1022 will irradiate to the reflective layer 103, and be reflected by the reflective layer 103 and then emitted from the backlight module, thereby improving a luminous efficiency of the backlight module.

As shown in FIG. 2 and FIG. 3, a surface of the substrate is disposed with a pad layer. The light-emitting chip includes a chip body and a pin layer electrically connected to the chip body. The pin layer is electrically connected to the pad layer through a conductive layer in the hollowed-out region.

Specifically, the pad layer includes the first pad 1021 and the second pad 1022. The first pad 1021 and the second pad 1022 are spaced apart on the substrate 101, and both the first pad 1021 and the second pad 1022 are electrically connected to an external control circuit. The light-emitting chip includes the chip body 106 and the pin layer electrically connected to the chip body 106. The chip body 106 is mainly composed of a light-emitting circuit for emitting light. The pin layer includes a first pin 1051 and a second pin 1052 disposed at intervals. The first pin 1051 and the second pin 1052 are connecting lines from the light-emitting circuit to a peripheral circuit. The conductive layer includes a first conductor 1041 and a second conductor. The first conductor 1041 and the second conductor can be conductive glue or solder paste. The conductive glue is preferably anisotropic conductive film (ACF).

The pin layer is electrically connected to the pad layer through the conductive layer in the hollowed-out region. It should be noted that the hollowed-out region is an opening structure in the reflective layer 103, or can be a plurality of spaced opening structures in the reflective layer 103. The hollowed-out region in the backlight module shown in FIG. 2 and FIG. 3 is an opening structure in the reflective layer 103. Specifically, the first pin 1051 is electrically connected to the first pad 1021 in the hollowed-out region through the first conductor 1041, and the second pin 1052 is electrically connected to the second pad 1022 in the hollowed-out region through the second conductor. In this way, the light-emitting chip is electrically connected with the external control circuit, and the light-emitting chip is controlled by the external control circuit.

As shown in FIG. 2 and FIG. 3, a projection of the chip body 106 on the substrate 101 covers a part of a projection of the pad layer on the substrate 101, and the reflective layer 103 is at least partially disposed on a surface of the pad layer.

Specifically, the projection of the chip body 106 on the substrate 101 in the backlight module shown in FIG. 2 and FIG. 3 covers a part of a projection of the first pad 1021 on the substrate 101 and a part of a projection of the second pad 1022 on the substrate 101. The reflective layer 103 is partially disposed on surfaces of the first pad 1021 and the second pad 1022, and another part of the reflective layer 103 is disposed on the surface of the substrate 101. It should be noted that the projection of the chip body 106 on the substrate 101 entirely covers the projection of the pad layer on the substrate 101, and the reflective layer 103 is at least partially disposed on the surface of the substrate. For example, the reflective layer 103 is partially disposed on the surface of the substrate 101, and another part of the reflective layer 103 is disposed on the surfaces of the first pad 1021 and the second pad 1022. In another example, entire reflective layer 103 is disposed on the surface of the substrate 101, that is, the reflective layer 103, the first pad 1021, and the second pad 1022 are disposed on a same layer.

As shown in FIG. 2 and FIG. 3, a distance D1 between the reflective layer 103 and the chip body 106 in a direction perpendicular to the substrate 101 is greater than a second predetermined value.

Specifically, in a manufacturing process of the backlight module, the reflective layer 103 needs to be fabricated first, and then the light-emitting chip is respectively soldered to the first pad 1021 and the second pad 1022 in the hollowed-out region of the reflective layer 103, that is, a die-bonding. Therefore, there is the distance D1 between the reflective layer 103 and the chip body 106, so as to prevent the light-emitting chip from an occurrence of virtual soldering during a die-bonding operation, and improve a yield of the backlight module.

It should be noted that the second predetermined value can be set by combined a manufacturing accuracy of the reflective layer and an accuracy of the die-bonding, where the manufacturing accuracy of the reflective layer refers to a deviation between a predetermined size of the reflective layer and an actual size of the reflective layer made according to the predetermined size, and the accuracy of the die-bonding refers to a deviation between a predetermined position of the light-emitting chip during die-bonding and an actual position of the light-emitting chip after die-bonding according to the predetermined position. In general, the reflective layer 103 is white oil. A range of manufacturing accuracy is 50-100 microns, and a range of die-bonding accuracy is 25-50 microns. Therefore, the second predetermined value can be selected as 150 microns to ensure that the actual backlight module will not cause the occurrence of virtual soldering of the light-emitting chip due to an influence of the manufacturing accuracy of the reflective layer and the accuracy of die-bonding. Of course, this value is only an example of the second predetermined value, and does not constitute a limitation thereof, and the second predetermined value can be flexibly adjusted by those skilled in the art according to actual needs.

As shown in FIG. 2 and FIG. 3, a distance between a projection of any one of the conductive layer or the pin layer on the substrate 101 and a projection of the edge of the hollowed-out region on the substrate 101 is greater than a third predetermined value.

Specifically, the reflective layer 103 is usually white oil, and the white oil is an insulator. If the white oil contacts any of the first conductor 1041, the second conductor, the first pin 1051, or the second pin 1052, it will affect a conductivity of the first conductor 1041, the second conductor, the first pin 1051, or the second pin 1052 that is in contact with the white oil, thereby reducing a luminous brightness of the light-emitting chip. Therefore, all the first conductor 1041, the second conductor, the first pin 1051, and the second pin 1052 are spaced from the reflective layer 103, which can ensure that a brightness of the light-emitting chip is not affected.

It should be noted that the third predetermined value can be set by combining the manufacturing accuracy of the reflective layer and the accuracy of die-bonding. In general, the reflective layer 103 is white oil, the manufacturing accuracy of white oil is 50-100 microns, and the accuracy of die-bonding ranges from 25 microns to 50 microns, so the third predetermined value can be selected as 150 microns to ensure that the actual manufactured backlight module will not lead to the reflective layer to contact any of the first conductor 1041, the second conductor, the first pin 1051, or the second pin 1052 caused by the manufacturing accuracy of the reflective layer and the accuracy of die-bonding. Of course, this value is only an example of the third predetermined value, and does not constitute a limitation thereof, and the third predetermined value can be flexibly adjusted by those skilled in the art according to actual needs.

Hereinafter, other modified structures of the backlight module provided by the embodiments of the present application will be described.

It can be seen from the above embodiment that the hollowed-out region can also be a plurality of spaced opening structures in the reflective layer 103. An embodiment of the present application takes two spaced opening structures in the reflective layer 103 as the hollowed-out region as an example for description. Wherein, the two opening structures of the hollowed-out region are respectively referred to as a first hollowed-out sub-region and a second hollowed-out sub-region.

Figure 4:
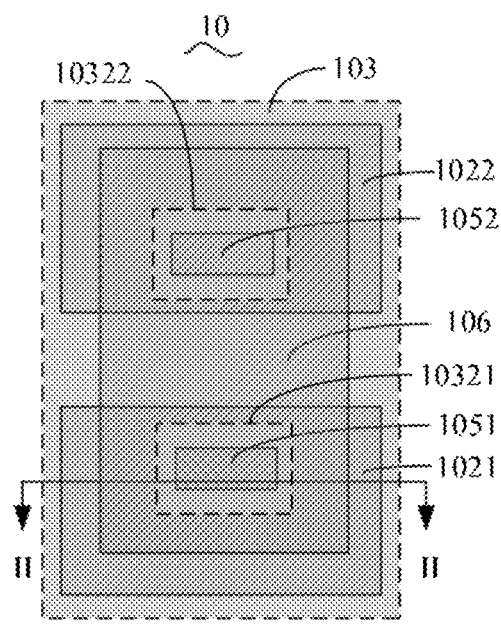
FIG. 4 is a schematic partial top view of a second backlight module provided by an embodiment of the present application.

FIG. 4 is a partial top view of a second backlight module provided by an embodiment of the present application. As shown in FIG. 4, a projection of a reflective layer 103 on the substrate 101 includes an outer edge 1031 and an inner edge 1032, and the inner edge 1032 includes a first inner edge 10321 and a second inner edge 10322 spaced apart. A projection of the first hollowed-out sub-region on the substrate 101 is the first inner edge 10321, and a projection of the second hollowed-out sub-region on the substrate 101 is the second inner edge 10322. Wherein, the outer edge 1031 surrounds a projection of the light-emitting chip on the substrate 101, and is spaced from the projection of the light-emitting chip on the substrate 101. The first inner edge 10321 and the second inner edge 10322 are at least partially positioned within a coverage of the projection of the light-emitting chip on the substrate 101.

Specifically, the projection of the light-emitting chip on the substrate 101 is rectangular, the outer edge 1031 encloses a closed region and the closed region is rectangular, and the outer edge 1031 is spaced from the projection of the light-emitting chip on the substrate 101. It should be noted that the projection of the light-emitting chip on the substrate 101 can also be square, circular, or other shapes, which are mainly determined according to a shape of the light-emitting chip. A shape of the closed region enclosed by the outer edge 1031 can also be square, circular, or other shapes, which can be flexibly adjusted by those skilled in the art according to actual application requirements.

The first inner edge 10321 encloses a closed region and the closed region is rectangular. The first inner edge 10321 is positioned within the projection of the light-emitting chip on the substrate 101, and a distance between the first inner edge 10321 and the projection of the light-emitting chip on the substrate 101 is greater than a first predetermined value. Wherein, the first predetermined value can be flexibly adjusted by those skilled in the art according to actual application requirements. It should be noted that the closed region enclosed by the first inner edge 10321 can also be square, circular, or other shapes, and those skilled in the art can flexibly adjust according to actual application requirements. The closed region enclosed by the first inner edge 10321 can also coincide with the projection of the light-emitting chip on the substrate 101, that is, there is no distance between the first inner edge 10321 and the projection of the light-emitting chip on the substrate 101.

The second inner edge 10322 encloses a closed region and the closed region is rectangular. The second inner edge 10322 is positioned within the projection of the light-emitting chip on the substrate 101, and a distance between the second inner edge 10322 and the projection of the light-emitting chip on the substrate 101 is greater than the first predetermined value. Wherein, the first predetermined value can be flexibly adjusted by those skilled in the art according to actual application requirements. It should be noted that the closed region enclosed by the second inner edge 10322 can also be square, circular, or other shapes, and those skilled in the art can flexibly adjust according to actual application requirements. The closed region enclosed by the second inner edge 10322 can also coincide with the projection of the light-emitting chip on the substrate 101, that is, there is no distance between the second inner edge 10322 and the projection of the light-emitting chip on the substrate 101.

It should be noted that a cross-sectional view of the backlight module shown in FIG. 4 along line II-II is shown in FIG. 3. Since the cross-sectional structure of the backlight module shown in FIG. 3 has been described in detail in the above embodiment, it will not be repeated here.

It is understandable that compared with the light-emitting region 10 shown in FIG. 2 and FIG. 3, the light-emitting region 10 shown in FIG. 4 is further disposed with a reflective layer 103 between the first hollowed-out sub-region and the second hollowed-out sub-region. That is, an area of the reflective layer 103 is larger, so that the luminous efficiency of the backlight module can be further improved.

Figure 5:
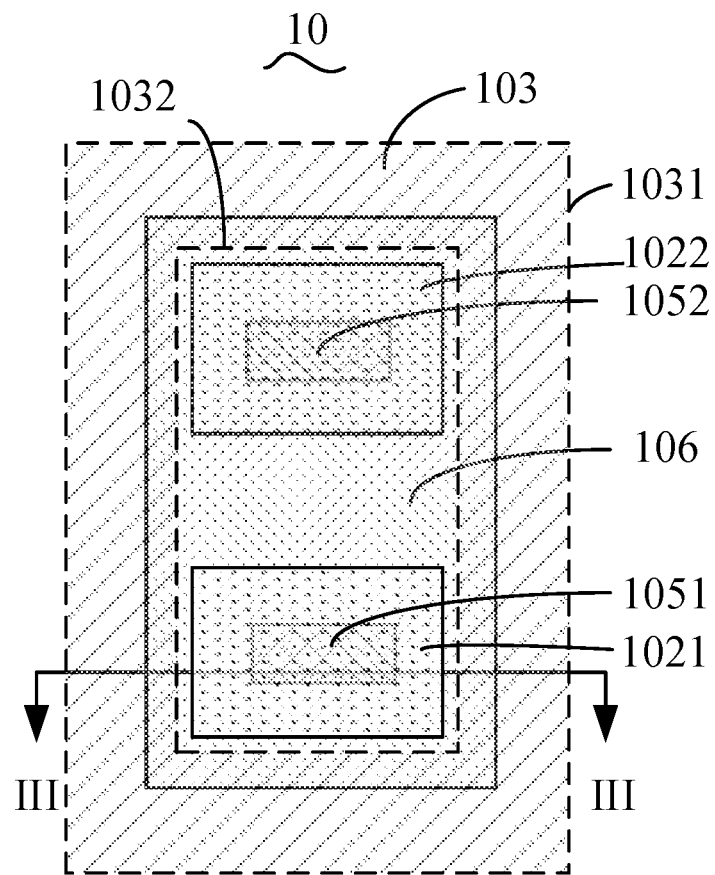
FIG. 5 is a schematic partial top view of a third backlight module provided by an embodiment of the present application.
Figure 6:
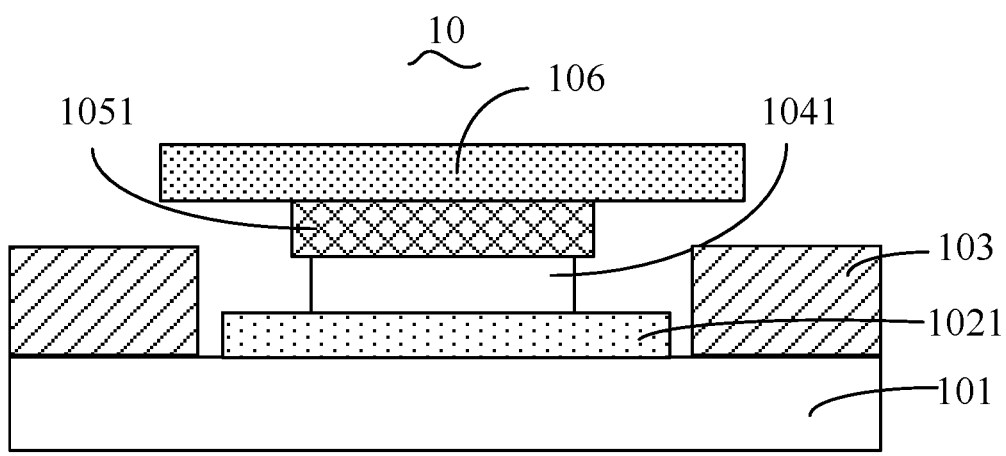
FIG. 6 is a cross-sectional view of the backlight module shown in FIG. 5 along line III-III.

It can be seen from the above embodiment that the hollowed-out region can be an opening structure in the reflective layer 103, and the projection of the chip body 106 on the substrate 101 can also cover all the projections of the pad layer on the substrate 101. At this time, the reflective layer 103 is at least partially disposed on the surface of the substrate. In the embodiment of the present application, the structure of the backlight module in this case is described by taking the hollowed-out region as an opening structure in the reflective layer 103 as an example. FIG. 5 is a partial top view of a third backlight module provided by an embodiment of the present application. FIG. 6 is a cross-sectional view of the backlight module shown in FIG. 5 along the line III-III. As shown in FIG. 5 and FIG. 6, a projection of the reflective layer 103 on the substrate 101 includes an outer edge 1031 and an inner edge 1032. The projection of the edge of the hollowed-out region on the substrate 101 is the above-mentioned inner edge 1032. The light-emitting chip is mounted on the substrate 101 through the hollowed-out region. Wherein, the outer edge 1031 surrounds the projection of the light-emitting chip on the substrate 101, is spaced from the projection of the light-emitting chip on the substrate 101, and the inner edge 1032 is at least partially positioned within the coverage of the projection of the light-emitting chip on the substrate 101.

Specifically, the projection of the light-emitting chip on the substrate 101 is rectangular, the outer edge 1031 encloses a closed region and the closed region is rectangular, and the outer edge 1031 is spaced from the projection of the light-emitting chip on the substrate 101. It should be noted that the projection of the light-emitting chip on the substrate 101 can also be square, circular, or other shapes, which are mainly determined according to a shape of the light-emitting chip. A shape of the closed region enclosed by the outer edge 1031 can also be square, circular, or other shapes, which can be flexibly adjusted by those skilled in the art according to actual application requirements.

The inner edge 1032 encloses a closed region and the closed region is rectangular. The inner edge 1032 is positioned within the projection of the light-emitting chip on the substrate 101, and a distance between the inner edge 1032 and the projection of the light-emitting chip on the substrate 101 is greater than a first predetermined value. Wherein, the first predetermined value can be flexibly adjusted by those skilled in the art according to actual application requirements. It should be noted that the closed region enclosed by the inner edge 1032 can also be square, circular, or other shapes, and those skilled in the art can flexibly adjust according to actual application requirements. The closed region enclosed by the inner edge 1032 can also coincide with the projection of the light-emitting chip on the substrate 101, that is, there is no distance between the inner edge 1032 and the projection of the light-emitting chip on the substrate 101.

Figure 7:
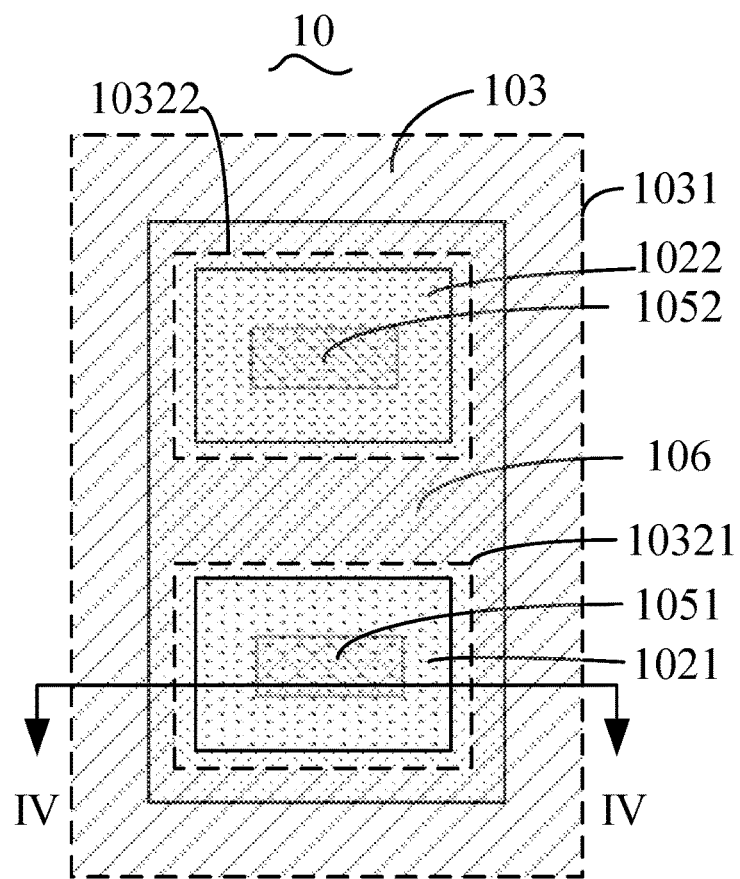
FIG. 7 is a schematic partial top view of a fourth backlight module provided by an embodiment of the present application.

It can be seen from the above embodiment that the hollowed-out region can also be a plurality of spaced opening structures in the reflective layer 103, and the projection of the chip body 106 on the substrate 101 can also cover all the projections of the pad layer on the substrate 101. At this time, the reflective layer 103 is at least partially disposed on the surface of the substrate. The embodiment of the present application takes the hollowed-out region as an example of the two spaced opening structures in the reflective layer 103 as an example to describe the structure of the backlight module in this case. The two opening structures of the hollowed-out region are respectively called the first hollowed-out sub-region and the second hollowed-out sub-region. FIG. 7 is a schematic partial top view of a fourth backlight module provided by an embodiment of the present application. As shown in FIG. 7, a projection of the reflective layer 103 on the substrate 101 includes an outer edge 1031 and an inner edge 1032, and the inner edge 1032 includes a first inner edge 10321 and a second inner edge 10322 spaced apart. A projection of the first hollowed-out sub-region on the substrate 101 is the afore-mentioned first inner edge 10321, and a projection of the second hollowed-out sub-region on the substrate 101 is the afore-mentioned second inner edge 10322. Wherein, the outer edge 1031 surrounds a projection of the light-emitting chip on the substrate 101, and is spaced from the projection of the light-emitting chip on the substrate 101. The first inner edge 10321 and the second inner edge 10322 are at least partially positioned within a coverage of the projection of the light-emitting chip on the substrate 101.

Specifically, the projection of the light-emitting chip on the substrate 101 is rectangular, the outer edge 1031 encloses a closed region and the closed region is rectangular, and the outer edge 1031 is spaced from the projection of the light-emitting chip on the substrate 101. It should be noted that the projection of the light-emitting chip on the substrate 101 can also be square, circular, or other shapes, which are mainly determined according to a shape of the light-emitting chip. A shape of the closed region enclosed by the outer edge 1031 can also be square, circular, or other shapes, which can be flexibly adjusted by those skilled in the art according to actual application requirements.

The first inner edge 10321 encloses a closed region and the closed region is rectangular. The first inner edge 10321 is positioned within the projection of the light-emitting chip on the substrate 101, and a distance between the first inner edge 10321 and the projection of the light-emitting chip on the substrate 101 is greater than a first predetermined value. Wherein, the first predetermined value can be flexibly adjusted by those skilled in the art according to actual application requirements. It should be noted that the closed region enclosed by the first inner edge 10321 can also be square, circular, or other shapes, and those skilled in the art can flexibly adjust according to actual application requirements. The closed region enclosed by the first inner edge 10321 can also coincide with the projection of the light-emitting chip on the substrate 101, that is, there is no distance between the first inner edge 10321 and the projection of the light-emitting chip on the substrate 101.

The second inner edge 10322 encloses a closed region and the closed region is rectangular. The second inner edge 10322 is positioned within the projection of the light-emitting chip on the substrate 101, and a distance between the second inner edge 10322 and the projection of the light-emitting chip on the substrate 101 is greater than the first predetermined value. Wherein, the first predetermined value can be flexibly adjusted by those skilled in the art according to actual application requirements. It should be noted that the closed region enclosed by the second inner edge 10322 can also be square, circular, or other shapes, and those skilled in the art can flexibly adjust according to actual application requirements. The closed region enclosed by the second inner edge 10322 can also coincide with the projection of the light-emitting chip on the substrate 101, that is, there is no distance between the second inner edge 10322 and the projection of the light-emitting chip on the substrate 101.

It should be noted that a cross-sectional view of the backlight module shown in FIG. 7 along the line IV-IV is shown in FIG. 6. Since the cross-sectional structure of the backlight module shown in FIG. 6 is similar to the cross-sectional structure of the backlight module shown in FIG. 3, and the cross-sectional structure of the backlight module shown in FIG. 3 has been described in detail in the above-mentioned embodiment, it will not be repeated here.

It is understandable that compared with the light-emitting region 10 shown in FIG. 5 and FIG. 6, the light-emitting region 10 shown in FIG. 7 is further disposed with a reflective layer 103 between the first hollowed-out sub-region and the second hollowed-out sub-region. That is, an area of the reflective layer 103 is larger, so that the luminous efficiency of the backlight module can be further improved.

As a preferred embodiment, in an embodiment of the present application, dimensions of a first pad 1021, a second pad 1022, a first conductor 1041, a second conductor, a chip body 106, a first pin 1051, a second pin 1052, and a reflective layer 103 in the light-emitting region 10 will be described.

In order to make a distance D1 between the reflective layer 103 and the chip body 106 in a direction perpendicular to the substrate 101 greater than a second predetermined value, conductive materials can be used to make a thicker first conductor 1041 and second conductor, for example, conductive glue (such as ACF) or use solder paste to make the first conductor 1041 and the second conductor with a thickness of about 35 microns. Alternatively, using a reflective material to make an ultra-thin reflective layer 103, for example, using white oil to make the reflective layer 103 with a thickness of 1-30 microns. Alternatively, increasing thicknesses of the first the pin 1051 and the second pin 1052 so that the thicknesses of the first pin 1051 and the second pin 1052 range between 0.1-50 microns. Alternatively, increasing thicknesses of the first pad 1021 and the second pad 1022, the thicknesses of the first pad 1021 and the second pad 1022 range between 0.1-50 microns. It should be noted that the above-mentioned multiple adjustment means can be used at same time to ensure that the distance D1 between the reflective layer 103 and the chip body 106 in the direction perpendicular to the substrate 101 is greater than the second predetermined value.

As a preferred embodiment, an embodiment of the present application specifically describes dimensions of the light-emitting region 10 shown in FIG. 2 and FIG. 3. As shown in FIG. 2 and FIG. 3, a length of the light-emitting chip is M, a distance between an edge of the light-emitting chip and an edge of the first pin 1051 is L, a distance between an edge of the reflective layer 103 and an edge of the first pin 1051 is D, a thickness of the reflective layer 103 is T, a thickness of the first pin 1051 is Tp, a thickness of the conductor 1041 is Tw, a distance between the first pin 1051 and the second pin 1052 is A, and a width of the first pin 1051 is W, where W=(M−2L−A)/2. Wherein, W>15 microns, L>33 microns, A>21 microns, and M>80 microns.

Figure 8:
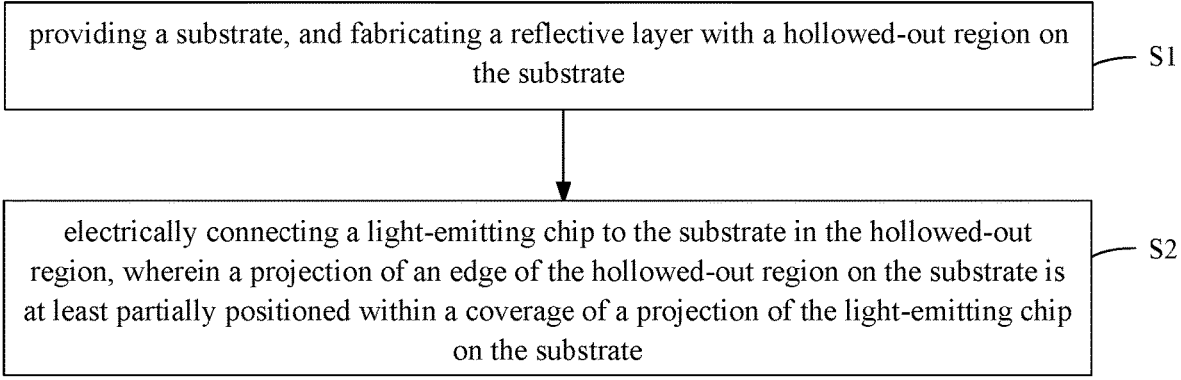
FIG. 8 is a flowchart of a manufacturing method of a backlight module provided by an embodiment of the present application.

FIG. 8 is a flowchart of a manufacturing method of a backlight module according to an embodiment of the present application. As shown in FIG. 8, the manufacturing method of the backlight module includes:

step S1, providing a substrate 101, and fabricating a reflective layer 103 with a hollowed-out region on the substrate 101; and step S2, electrically connecting a light-emitting chip to the substrate 101 in the hollowed-out region, wherein a projection of an edge of the hollowed-out region on the substrate 101 is at least partially positioned within a coverage of a projection of the light-emitting chip on the substrate 101.

It should be noted that the structure of the backlight module manufactured by the method disposed in the embodiments of the present application has been described in detail in the above-mentioned embodiments, and will not be repeated here. In each of light-emitting region of the backlight module, since the outer edge 1031 of the reflective layer 103 projected on the substrate 101 surrounds the projection of the light-emitting chip on the substrate 101 and is spaced from the projection of the light-emitting chip on the substrate 101, and the inner edge 1032 of the reflective layer 103 projected on the substrate 101 is at least partially positioned within the coverage of the projection of the light-emitting chip on the substrate 101, therefore, the light originally irradiated by the light-emitting chip on the substrate 101, the first pad 1021, or the second pad 1022 will irradiate to the reflective layer 103, and be reflected by the reflective layer 103 and then emitted from the backlight module, thereby improving the luminous efficiency of the backlight module.

Figure 9:
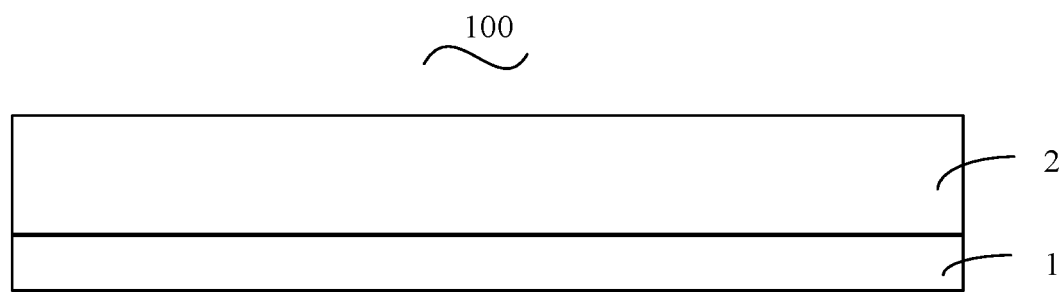
FIG. 9 is a schematic structural diagram of a liquid crystal display device provided by an embodiment of the present application.

FIG. 9 is a schematic structural diagram of a liquid crystal display device provided by an embodiment of the present application. As shown in FIG. 9, the liquid crystal display device 100 includes a liquid crystal display panel 2 and the backlight module 1 described in the foregoing embodiment.

It should be noted that the structure of the backlight module included in the liquid crystal display device disposed in the embodiments of the present application has been described in detail in the above-mentioned embodiments, and will not be repeated here. In each of light-emitting region of the backlight module, since the outer edge 1031 of the reflective layer 103 projected on the substrate 101 surrounds the projection of the light-emitting chip on the substrate 101 and is spaced from the projection of the light-emitting chip on the substrate 101, and the inner edge 1032 of the reflective layer 103 projected on the substrate 101 is at least partially positioned within the coverage of the projection of the light-emitting chip on the substrate 101. Therefore, the light originally irradiated by the light-emitting chip on the substrate 101, the first pad 1021, or the second pad 1022 will irradiate to the reflective layer 103, and be reflected by the reflective layer 103 and then emitted from the backlight module, thereby improving the luminous efficiency of the backlight module.

It can be understood that for those of ordinary skill in the art, equivalent replacements or changes can be made according to the technical solutions of the present application and its application concept, and all these changes or replacements shall fall within the protection scope of the appended claims of the present application.

What is claimed is:

1. A backlight module, comprising:
a substrate and a light-emitting chip and a reflective layer disposed on the substrate; wherein the reflective layer comprises a hollowed-out region, the light-emitting chip is electrically connected to the substrate in the hollowed-out region, and a projection of an edge of the hollowed-out region on the substrate is at least partially positioned within a coverage of a projection of the light-emitting chip on the substrate, the light-emitting chip comprises a chip body and a pin layer electrically connected to the chip body, a top surface of the reflective layer is located below the bottom surface of the chip body, a surface of the substrate is disposed with a pad layer, and the pin layer is electrically connected to the pad layer through a conductive layer in the hollowed-out region, a distance between a projection of any one of the conductive layer or the pin layer on the substrate and the projection of the edge of the hollowed-out region on the substrate is greater than a third predetermined value, the pin layer comprises a first pin and a second pin, the conductive layer comprises a first conductor and a second conductor, and any one of the first conductor, the second conductor, the first pin, and the second pin are spaced from the reflective layer.

2. The backlight module according to claim 1, wherein the projection of the edge of the hollowed-out region on the substrate is positioned within the projection of the light-emitting chip on the substrate, and a distance between the edge of the hollowed-out region and the projection of the light-emitting chip on the substrate is greater than a first predetermined value.

3. The backlight module according to claim 1, wherein
the pad layer comprises a first pad and a second pad, and the hollowed-out region comprises a first hollowed-out sub-region and a second hollowed-out sub-region, wherein the first pin in the first hollowed-out sub-region is electrically connected to the first pad through the first conductor, the second pin in the second hollowed-out sub-region is electrically connected to the second pad through the second conductor, and the reflective layer is further disposed between the first hollowed-out sub-region and the second hollowed-out sub-region.

4. The backlight module according to claim 3, wherein a thickness of the second conductor is about 35 microns, a thickness of the reflective material is 1-30 microns, the thicknesses of the first pin and the second pin range between 0.1-50 microns, and the thicknesses of the first pad and the second pad range between 0.1-50 microns.

5. The backlight module according to claim 3, wherein a length of the light-emitting chip is defined as M, a distance between an edge of the light-emitting chip and an edge of the first pin is defined as L, a distance between an edge of the reflective layer and an edge of the first pin is defined as D, a thickness of the reflective layer is defined as T, a thickness of the first pin is defined as Tp, a thickness of the conductor is defined as Tw, a distance between the first pin and the second pin is defined as A, and a width of the first pin is defined as W, where W=(M−2L−A)/2, wherein, W>15 microns, L>33 microns, A>21 microns, and M>80 microns.

6. The backlight module according to claim 1, wherein
a projection of the chip body on the substrate covers a part of a projection of the pad layer on the substrate, and the reflective layer is at least partially disposed on a surface of the pad layer.

7. The backlight module according to claim 1, wherein
a projection of the chip body on the substrate entirely covers a projection of the pad layer on the substrate, and the reflective layer is at least partially disposed on the surface of the substrate.

8. The backlight module according to claim 1, wherein part of the reflective layer is partially disposed on a surface of the substrate, and another part of the reflective layer is disposed on surfaces of the first pad and the second pad; or
an entire one of the reflective layer is disposed on a surface of the substrate.

9. A manufacturing method of a backlight module, comprising:
providing a substrate, and fabricating a reflective layer with a hollowed-out region on the substrate; and
electrically connecting a light-emitting chip to the substrate in the hollowed-out region,
wherein a projection of an edge of the hollowed-out region on the substrate is at least partially positioned within a coverage of a projection of the light-emitting chip on the substrate, and the light-emitting chip comprises a chip body and a pin layer electrically connected to the chip body, a top surface of the reflective layer is located below the bottom surface of the chip body, a surface of the substrate is disposed with a pad layer, and the pin layer is electrically connected to the pad layer through a conductive layer in the hollowed-out region, a distance between a projection of any one of the conductive layer or the pin layer on the substrate and the projection of the edge of the hollowed-out region on the substrate is greater than a third predetermined value, the pin layer comprises a first pin and a second pin, the conductive layer comprises a first conductor and a second conductor, and any one of the first conductor, the second conductor, the first pin, and the second pin are spaced from the reflective layer.

10. The manufacturing method of the backlight module according to claim 9, wherein
the projection of the edge of the hollowed-out region on the substrate is positioned within the projection of the light-emitting chip on the substrate, and a distance between the edge of the hollowed-out region and the projection of the light-emitting chip on the substrate is greater than a first predetermined value.

11. A liquid crystal display device, comprising:
a liquid crystal display panel and a backlight module;
wherein the backlight module comprises a substrate and a light-emitting chip and a reflective layer disposed on the substrate, the reflective layer comprises a hollowed-out region, the light-emitting chip is electrically connected to the substrate in the hollowed-out region, and a projection of an edge of the hollowed-out region on the substrate is at least partially positioned within a coverage of a projection of the light-emitting chip on the substrate, and the light-emitting chip comprises a chip body and a pin layer electrically connected to the chip body, a top surface of the reflective layer is located below the bottom surface of the chip body, a surface of the substrate is disposed with a pad layer, and the pin layer is electrically connected to the pad layer through a conductive layer in the hollowed-out region, a distance between a projection of any one of the conductive layer or the pin layer on the substrate and the projection of the edge of the hollowed-out region on the substrate is greater than a third predetermined value, the pin layer comprises a first pin and a second pin, the conductive layer comprises a first conductor and a second conductor, and any one of the first conductor, the second conductor, the first pin, and the second pin are spaced from the reflective layer.

12. The liquid crystal display device according to claim 11, wherein
the projection of the edge of the hollowed-out region on the substrate is positioned within the projection of the light-emitting chip on the substrate, and a distance between the edge of the hollowed-out region and the projection of the light-emitting chip on the substrate is greater than a first predetermined value.

13. The liquid crystal display device according to claim 11, wherein
the pad layer comprises a first pad and a second pad, and the hollowed-out region comprises a first hollowed-out sub-region and a second hollowed-out sub-region, wherein the first pin in the first hollowed-out sub-region is electrically connected to the first pad through the first conductor, the second pin in the second hollowed-out sub-region is electrically connected to the second pad through the second conductor, and the reflective layer is further disposed between the first hollowed-out sub-region and the second hollowed-out sub-region.

14. The liquid crystal display device according to claim 11, wherein
a projection of the chip body on the substrate covers a part of a projection of the pad layer on the substrate, and the reflective layer is at least partially disposed on a surface of the pad layer.

15. The liquid crystal display device according to claim 11, wherein
- a projection of the chip body on the substrate entirely covers a projection of the pad layer on the substrate, and the reflective layer is at least partially disposed on the surface of the substrate.

16. The liquid crystal display device according to claim 11, wherein part of the reflective layer is partially disposed on a surface of the substrate, and another part of the reflective layer is disposed on surfaces of the first pad and the second pad; or
- an entire one of the reflective layer is disposed on a surface of the substrate.

\* \* \* \* \*